United States Patent [19]

Ivory et al.

[11] 4,440,669

[45] Apr. 3, 1984

[54] ELECTRICALLY CONDUCTING COMPOSITIONS OF DOPED POLYPHENYLENES AND SHAPED ARTICLES COMPRISING THE SAME

[75] Inventors: Dawn M. Ivory, Stanhope; Granville G. Miller, Morristown; Ronald R. Chance; Ray H. Baughman, both of Morris Plains, all of N.J.

[73] Assignee: Allied Corporation, Morris Township, Morris County, N.J.

[21] Appl. No.: 234,511

[22] Filed: Feb. 17, 1981

Related U.S. Application Data

[63] Continuation-in-part of Ser. No. 22,237, Mar. 20, 1979, abandoned.

[51] Int. Cl.$^3$ .............................................. H01B 1/06
[52] U.S. Cl. .................................. 252/518; 252/500; 528/487; 528/488; 528/490
[58] Field of Search .................. 252/518, 512, 500, 6, 252/2.3 Q, 300; 428/901; 357/8, 15; 526/4; 528/396, 397, 480, 488, 485, 487, 489, 490; 524/404, 406, 408, 409, 411, 412, 435, 437, 438

[56] References Cited

U.S. PATENT DOCUMENTS 3,775,177 11/1973 Hayama et al.
4,204,216 5/1980 Heeger et al. ..................... 252/500
4,222,903 9/1980 Heeger et al. ..................... 252/500
4,269,738 5/1981 Guido ................................. 252/500

OTHER PUBLICATIONS

Organic Semi-conducting Polymers, J. E. Katon (ed.), 1968, pp. 111, 174–177, 197.
J. Chem. Soc., Chem. Comm., T. C. Clarke et al., "Highly Conducting Transition Metal Derivatives of Polyacetylene", Jun. 1978, pp. 489–490.
J. Polym. Sci., Kovacic et al., "Properties of p-Polyphenyl", 1965, vol. A3, pp. 4279–8.
J. Applied Polym. Sci., D. M. Gale, "Fabrication of Poly (p-phenylene) by Powder Forming Technique", 1978, vol. 22, p. 1955.
Polymer Preprints, S. B. Mainthia et al., "Electronic Conductivity of Complexes of Poly-p-phenylene," 1963, vol. 4, pp. 208–212.
J. Am. Chem. Soc., Marvel et al., "Preparation and Aromatization of Poly-1,3-cyclohexadiene", 1959, vol. 81, pp. 448–452.
J. Am. Chem. Soc., P. Kovacic, "Polymerization of Benzene to p-polyphenyl by Al Chloride/CuCl$_2$", 1963, vol. 85, pp. 454–458.
J. Am. Chem. Soc., C. K. Chiang et al., "Synthesis of Highly Conducting Films", 1978, vol. 100, pp. 1013–1015.
Abstract of paper for New York Meeting of Am. Physical Society, Mar. 24–28, 1980, submitted by R. R. Chance.
J. Chem. Phys., D. M. Ivory et al., "Highly Conducting Charge Transfer Complexes", Aug. 1, 1979, vol. 71, pp. 1506–1507.
Berichte der Bunsenges, F. Beck, "Elec. Measurements for Characterizing Polymeric Semiconductors", 1964, vol. 68, pp. 559–560.
J. Chem. Soc., Chem. Comm., P. J. Nigrey et al., "Electrochemistry of Polyacetylene", 1979, pp. 594–595.

Primary Examiner—Josephine Barr
Attorney, Agent, or Firm—Alan M. Doernberg; Gerhard H. Fuchs; Robert A. Harman

[57] ABSTRACT

Electrically conducting doped poly(paraphenylene) compositions, and process of making such compositions, having direct current conductivities of at least $10^{-3}$ ohm$^{-1}$ cm$^{-1}$, at room temperature, and up to 100 ohm$^1$cm$^{-1}$ and above; especially wherein the doping agent is a Group IA metal arene, a Group V halide, chlorine, bromine, or a mixture thereof; in particular potassium naphthalene, sodium naphthalene, AsF$_5$, chlorine, or a mixture thereof. The polymers are useful as electronic devices, as substrates for electroplating, as materials for absorption of solar and of radio frequency radiation, and in general wherever electrical conductivity of the metallic type or of the semiconductor type, and light weight, are desired.

22 Claims, No Drawings

ELECTRICALLY CONDUCTING COMPOSITIONS OF DOPED POLYPHENYLENES AND SHAPED ARTICLES COMPRISING THE SAME

This application is a continuation-in-part of our copending application Ser. No. 22,237 filed Mar. 20, 1979, now abandoned, and incorporates by reference the entire disclosure thereof except to the extent, if any, that the same may be inconsistent herewith.

BACKGROUND OF THE INVENTION

1. Field of the Invention

This invention relates to electrically conducting compositions, useful as electronic and optical materials, comprising a solid polymer polyphenylene and as the doping agent to confer electrical conductivity, an electron donor or acceptor, or mixture thereof.

2. Brief Description of the Prior Art

The electronics industry is continuously searching for new and improved materials for fabricating electronic components. Likewise, the plastics industry is in need of materials which have the property advantages of conventional organic polymers, but which are also electrically conducting. There is a special need in these industries for obtaining conducting materials exhibiting direct current conductivities of at least about $10^{-3}$ ohm$^{-1}$ cm$^{-1}$, and preferably greater than one ohm$^{-1}$ cm$^{-1}$, which also have the desired processibility, mechanical properties, low cost, and low density (i.e., light weight) characteristics of carbon backbone organic polymers.

Conductivities referred to herein, unless otherwise specified, are as measured at room temperature.

Carbon backbone polymers, possessing conductive properties, can be prepared by pyrolyzing or graphitizing organic polymers, e.g. via dehydrogenation at elevated temperatures. Such resulting conductivity is most likely due to the formation of electrically conducting graphitic structures. However, such pyrolyzed or graphitized polymers are difficult to prepare in a controlled fashion, and accordingly are likely to exhibit undesirable variation in electrical properties; and are not conveniently processible.

The only non-pyrolyzed non-graphitic carbon backbone organic materials known to use with conductivities as high as $10^{-3}$ ohm$^{-1}$ cm$^{-1}$ are complexes of unsubstituted polyacetylene, $+HC=CH+_x$, with specific electron donor or acceptor agents.

Researchers have tried for over twenty years to obtain highly conducting complexes of carbon backbone polymers. Recent efforts in the field to discover substituted polyacetylenes which also form highly conducting complexes, comparable to those of unsubstituted polyacetylene, have not been successful.

Complexes of uncrosslinked polyacetylene with iodine, iodine chloride, iodine bromide, sodium, and arsenic pentafluoride having conductivities ranging from that of the undoped polymers to between 50 to 560 ohm$^{-1}$ cm$^{-1}$ at 25° C. have been described in J. Am. Chem. Soc. 100, 1013 (1978). Also described therein are complexes of polyacetylene with hydrogen bromide, chlorine, and bromine having conductivities of up to at least between $7 \times 10^{-4}$ and 0.5 ohm$^{-1}$ cm$^{-1}$, where the highest conductivity in this range is for the bromine complex. L. R. Anderson, G. P. Pez, and S. L. Hsu in J. Chem. Soc., Chemical Communications pp. 1066–1067 (1978) describe bis(fluorosulfuryl) peroxide, $FSO_2OOSO_2F$, as a dopant for polyacetylene to produce a composition having a room temperature conductivity of about 700 ohm$^{-1}$ cm$^{-1}$. Also, the reference of J. Chem. Soc. Chem. Comm. 1979, p. 594–5 reports that poly-acetylene films electrochemically doped with aqueous KI solution or, $Bu_4NClO_4$ solution in methanylene chloride provide materials having room temperature conductivities of up to 970 ohm$^{-1}$ cm$^{-1}$. The possible application of polyacetylene complexes as electronic devices is described in App. Phys. Lett. 33, pp. 18–20 (1978).

Although such polyacetylene complexes are useful as electronic materials, they possess the disadvantages of environmental and thermal instability of the matrix polyacetylene. For example, even in the absence of oxygen, cis-polyacetylene transforms to trans-polyacetylene at a rate of a few percent a day at room temperature, which could result in a variation of electrical properties. Additionally, both isomers of polyacetylene readily react with oxygen, thereby changing the electronic properties of either doped or undoped polymer. The infusibility and insolubility of high molecular weight polyacetylene militates against melt or solution processing and the thermal reactivity in the form of crosslinking reactions also restricts or precludes the possibility of molding this polymer into shaped articles.

Certain charge transfer complexes of poly(p-phenylene) have been reported, none having conductivity as high as $10^{-3}$ ohm$^{-1}$ cm$^{-1}$ (Organic Semiconducting Polymers, J. E. Katon, Ed., 1968, p. 176).

In contrast to polyacetylene, poly(p-phenylene) although a conjugated polymer, has high thermal and oxidative stability. This polymer is stable at temperatures as high as 400° C. in air and 550° C. in inert atmospheres. Furthermore, poly(p-phenylene) exhibits exceptional resistance to radiation damage, as described in J. Polym. Sci. A3, pp. 4297–4298 (1965). Another advantage of poly(p-phenylene) is that objects having tensile strengths as high as 34,000 kPa (5000 psi) can be molded from this polymer using powder-metallurgical forming techniques without chemical degradation of the polymer, as described in J. Applied Polym. Sci. 22 pp. 1955–1969 (1978). Previous efforts to obtain poly(p-phenylene) complexes having conductivities as high as $10^{-3}$ ohm$^{-1}$ cm$^{-1}$ have been unsuccessful. The highest reported room temperature conductivity is $4 \times 10^{-5}$ ohm$^{-1}$ cm$^{-1}$, which was obtained for a poly(p-phenylene) complex with iodine, as described in Polymer Preprints 4, pp. 208–212 (1963). The temperature dependence of conductivity, $\sigma$, is given by the expression $\sigma = \sigma_0 e^{-E/kT}$ where $\sigma_0$ is a material constant, k is Bolzmann's constant ($8.6 \times 10^{-5}$ eV/degree), T is temperature in °K., and E is the activation energy for conductivity. E is reported by these authors to have a value of 0.87 eV between room temperature and $-100°$ C. By contrast, a much smaller temperature dependence is normally expected for a material to be a useful semiconductor. The above reference also describes the formation of a complex between poly(p-phenylene) and tetracyanoethylene. However, in this case the observed conductivity at room temperature ($10^{-11}$ ohm$^{-1}$ cm$^{-1}$) is even lower than that observed for the iodine complex.

SUMMARY OF THE INVENTION

We have unexpectedly discovered that electron donors and electron acceptors can be incorporated into polyphenylenes to produce novel materials having electrical conductivities which are continuously adjustable from $10^{-3}$ ohm$^{-1}$ cm$^{-1}$ to over 100 ohm$^{-1}$ cm$^{-1}$.

In accordance with this invention there is provided a composition comprising a solid polymer, consisting essentially of units having para-phenylene linkages, or of mixtures of such units with units having meta-phenylene linkages; and having incorporated therein an electron donor or acceptor doping agent, or mixture thereof, wherein:

(a) the direct current conductivity of the composition incorporating the electron donor agent alone is at least $10^{-3}$ ohm$^{-1}$ cm$^{-1}$; and (b) the direct current conductivity of the composition incorporating the electron acceptor agent alone, or in admixture with said electron donor agent, is at least $10^{-3}$ ohm$^{-1}$ cm$^{-1}$; said conductivities (a) and (b) being measured by the four-probe-in-line method at room temperature.

The direct current conductivity of certain compositions incorporating a doping agent can be controlled and reduced at least 5-fold and often much more, by adding a compensating agent to react with the doping agent, such as a doping agent of opposite type or an agent which reacts with the doping agent; for example an electron donor reactive with an electron acceptor dopant; for instance ammonia or an amine acts as a compensator for $AsF_5$ dopant.

By "units having para-phenylene linkages" we mean units incorporating the para-phenylene structure,

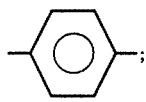

by "units having meta-phenylene linkages" we mean units incorporating the meta-structure,

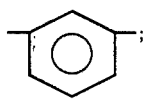

and by "polymer" we mean a composition in which at least eight such units are connected together. A simple compound useable for purposes of our invention is the dimer, biphenyl, which we find behaves like a poly (p-phenylene) as shown in Example 9 below. Also illustrative of useable compounds is phenanthrene of structure

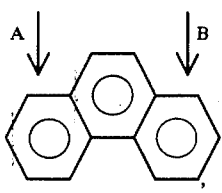

incorporating the two rings, designated "A" and "B" in the above formula, having similar linkages to those of biphenyl. A simple compound having a mixture of para-phenylene and meta-phenylene linkages is meta-terphenyl of structure wherein, as shown in Example 8, the two outer rings behave like p-phenylene units.

Mixtures of polymers can be used for purposes of our invention; and also mixtures of appropriate polymers along with other compounds, such as in pitches, e.g. asphalt and residues from distillation of tars.

Preferred embodiments of our compositions are those wherein the polyphenylene consists (at least in major part) of units having para-phenylene linkages, with the doping agent being an arsenical doping agent such as arsenic pentafluoride, sodium or potassium naphthalene, or chlorine and being present in an amount of about $10^{-5}$ to 2 moles per mole of phenylene units in said polymer. Certain preferred compositions have direct current conductivities of at least $10^{-2}$ ohm$^{-1}$ cm$^{-1}$ at room temperatures; some have values as high as 1, 10, and over 100.

Further provided is a shaped article of manufacture comprising the above-described composition. Preferred embodiments of the shaped article are an electrical conductor, a semiconductor, an n-p type junction, an infrared radiation absorber, and a radio frequency radiation absorber.

Also provided is a process of making compositions of the invention.

DESCRIPTION OF THE INVENTION AND THE PREFERRED EMBODIMENTS

The novelty of this invention is in the discovery that the electrical conductivity of polyphenylene can be surprisingly increased by the addition of specific electron donor and/or electron acceptor agents, to values of about $10^{-3}$ ohm$^{-1}$ cm$^{-1}$ and greater, by incorporating into the polymer an appropriate electron acceptor or donor doping agent, or admixture of agents.

The reason why this result occurs is not clearly understood. A theory that we do not wish to be bound by is that a "charge-transfer complex" is formed between the matrix polymer as host, and the incorporated electron donor or acceptor. This complex is strikingly different in electrical properties as contrasted to a simple mixture of the polymer and agent. The complex behaves electrically as a semiconductor or a metal while a simple mixture with such agent mainly exhibits the electrical properties of the matrix polymer, i.e. a nonconductor or an insulator. Thus, the term "incorporated therein" does not includes simple mixtures of polyphenylene and electron donors or acceptors, or mixtures thereof, wherein the conductivity is not at least $10^{-3}$ ohm$^{-1}$ cm$^{-1}$. The appearance of optical absorption bands in the infrared, visible or ultraviolet regions in the doped polymer, which are not present in the dopant or polyphenylene taken separately, distinguishes between a simple mixture and a chargetransfer complex.

A moderately large number of electron donor or acceptor agents will operate to surprisingly increase the direct current conductivity of polyphenylene, as for example, arsenic pentafluoride, Group IA metals and Group IA metal arenes. However, not all known doping agents are effective. As illustrated by specific Example 5 below, bromine (a known room temperature agent for greatly increasing the conductivity of polyacetylene to greater than 100 ohm$^{-1}$ cm$^{-1}$) was found not effective at room temperature in increasing the conductivity of polyphenylene even to a value as high as reported for iodine doping.

The reason for this is not clear. A theory that we do not wish to be bound by is that the incorporation of the doping agent into polyphenylene results in the fractional ionization, e.g. sodium atom to sodium cation, of at least about ten mole percent of the incorporated agent. This would be expected to lead then to formation of the charge-transfer complex of particular structure resulting in a dramatic increase in conductivity. One skilled in the art from this disclosure will be able to very simply test particular electron donor or acceptor agents, or mixtures thereof, not specifically described herein, in polyphenylene to determine if a dramatic increase in conductivity occurs. Those resulting compositions incorporating an electron donor agent, and those compositions incorporating an acceptor agent, or mixture of donor and acceptor agents, having a direct current conductivity of greater than about $10^{-3}$ ohm$^{-1}$ cm$^{-1}$, are regarded as being within the scope of the present invention. Surprisingly, chlorine and bromine are effective dopants at high temperature for polyphenylene by this test, as illustrated by specific Examples below.

By the term "four-probe method", as used herein, is meant the known and accepted art method of measuring the electrical conductivity of a polymeric film or material using either A.C. or D.C. current between four contacts. A description of the four-probe method is made in J. Am. Chem. Soc. 100, pp. 1014–16 (1978), and hereby incorporated by reference for that purpose. Specific details regarding the apparatus and procedure used are given in the Examples.

A preferred polymer from the viewpoint of obtaining the highest conductivities for the composition is essentially a solid, high molecular weight poly(p-phenylene) i.e. a poly(p-phenylene) polymer consisting essentially of units having para-phenylene linkages. By this is meant that at least about 90 numerical percent of the structural units of the polymer are para-phenylene units. Also, such polymer should be a solid and possess a sufficiently high molecular weight to be insoluble in conventional solvents and infusible. The molecular weight cannot be reliably determined for high molecular weight poly(p-phenylene) because of the insolubility and infusibility of this polymer. The color of the high molecular weight poly(p-phenylene) polymer typically ranges from yellow to purple-black.

A wide variety of methods for synthesizing poly(p-phenylene) are well known. As an example, benzene polymerizes to poly(p-phenylene) under mild reaction conditions by various combinations of Lewis acid catalysts and oxidizing agents. A particularly efficient system is the aluminum chloride-cupric chloride system which provides poly(p-phenylene) in high yield after 0.5 hour at 35° C., as described in J. Am. Chem. Soc. 85, 454–458 (1963). As described in J. Am. Chem. Soc. 81, pp. 448–452 (1959) dehydration of poly(1,3-cyclohexadiene) yields poly(p-phenylene). Another method is via halogenation and pyrolysis of poly-1,3-cyclohexadiene (J. Pol. Sci. Part A, vol. 1 pp. 2057–2065 of 1963 and vol. 3, pp. 1553–1565 of 1965). These and other methods known in the art are suitable for preparing solid high molecular weight poly(p-phenylene), characterized by insolubility in conventional solvents and infusibility, which consists essentially of para-phenylene linkages.

A further aspect of the present invention is that the low molecular weight phenylene compounds including specifically biphenyl, p-terphenyl, m-terphenyl, p-quaterphenyl, p-quinquephenyl, and p-sexiphenyl undergo both enhancement of conductivity and also polymerization, upon prolonged exposure to strong Lewis acids such as $AsF_5$. A particular utility of such combined doping and polymerization process arises from the ready processibility in solution or in melt phase of the low molecular weight phenylene compounds (also called phenylene oligomers) having from 2 to 8 phenylene units, whereby they can be put into a desired form, such as Schottky barrier diodes using n-type or p-type inorganic semiconductors against a poly(p-phenylene) doped composition, obtained using such phenylene oligomers and having metallic conductivity.

The above noted phenylene oligomers can be obtained, for example, by the action of a sodium-potassium alloy on halogen derivatives of benzene, according to the method described in J. Polym. Sci. 16, (589–597 (1955). Other methods for synthesizing polyphenylene oligomers which are soluble and/or fusible are described in J. Macromol Sci. (Chem.), A1, 183–197 (1967). The methods described therein utilize the cationic oxidation/polymerization or copolymerization of aromatic hydrocarbons such as m-terphenyl, biphenyl, and benzene. The processible p-phenylene oligomers having from 2 to 8 para-phenylene units, doped with a doping agent whereby the conductivity is at least $10^{-3}$ ohm$^{-1}$ cm$^{-1}$, form preferred compositions of this invention.

Doping agents applicable in the subject compositions include electron donor agents, which increase the inherent conductivity of polyphenylene to a value of at least about $10^{-3}$ ohm$^{-1}$ cm$^{-1}$ and likewise acceptor agents or admixtures of donor and acceptor agents which increase the conductivity of polyphenylene to a value of at least about $10^{-3}$ ohm$^{-1}$ cm$^{-1}$. Certain preferred compositions have direct current conductivity of at least $10^{-2}$ ohm$^{-1}$ cm$^{-1}$, at room temperatures, as measured by the four-probe method; some values being as high as 1, 10, and over 100 ohm$^{-1}$ cm$^{-1}$.

Representative examples of applicable doping agents include electron donor agents such as Group IA metals, including lithium, sodium, potassium, rubidium, and cesium; and Group IA metal arenes, such as sodium and potassium naphthalene, sodium and potassium biphenyl; and electron acceptors such as Brönstead acids including $HSO_3F$; non-metal oxides including $SO_3$ and $N_2O_5$; Group V element sulfides including $Sb_2S_5$; and halides of metals of Groups VIB, VIII, IB, IIIA and VA; halides of inert gases; mixed halides; and fluorine-containing peroxides. Such halide dopants include $SbCl_5$, $SbF_5$, $SbBr_3$, $CrO_2Cl_2$, $CrO_2F_2$, $SbF_3Cl_2$, $AsF_5$, $XeF_4$, $XeOF_4$, $PF_5$, $BF_5$, $BCl_3$, $BCl_5$, $IF_5$, $HSO_3F$ and $FSO_2OOSO_2F$. Mixtures of dopants can be used and in some cases may be necessary. (See Example 16 below). Preferred electron donor agents are selected from the group consisting of Group IA metals and Group IA metal arenes. Particularly preferred are sodium naphthalene and potassium naphthalene. Preferred electron acceptor agents are the Group VA element halides, particularly arsenic pentafluoride.

A further preferred dopant is chlorine, used at elevated temperatures. The type of conductivity conferred by chlorine is presently not known to us but does not appear to be due primarily to crosslinking since a maximum conductivity has been noted as the amount of chlorine used is increased, beyond which the conductivity beings to decline as further increments of chlorine are supplied. Fluorine, bromine and mixed halogen such as ICl are also effective when elevated temperatures are used during doping.

Doping can be effected by contacting the agent in solution or in gas phase with the polymer, or electrochemically, as illustrated in the Examples below.

The type of dopant chosen depends upon the particular electronic characteristics desired in the resulting composition. For example when semiconductors are desired, donor dopants, such as the Group IA metals and Group IV metal arenes can provide n-type semiconductive material (electron conductivity) while acceptor dopants, such as AsF$_5$ can provide p-type material (hole conductivity).

The interface between electron donor-doped and acceptor-doped semiconductive compositions provides an n-p junction which can serve, for example, as a rectifier. Such junctions can be provided by methods well known in the art, such as by mechanically pressing together sheets of n-doped and p-doped materials. Alternatively, one end of a sheet of polymer can be doped with a donor while the opposite end is doped with an acceptor, thereby providing an n-p junction at the interface between these differently doped regions.

The concentration of conductor doping agent in the composition is from about $10^{-5}$ to 2 moles per mole of phenylene unit in the polymer. The highest conductivity is generally obtained by using either donor or acceptor dopants, rather than using a mixture of the two types. The conductivity generally increases with increasing dopant concentration and the highest obtainable dopant concentration normally corresponds to not over about 2 moles of dopant per mole of phenylene units in polyphenylene. The major conductivity increase in going from undoped polyphenylene to the fully doped polymer generally occurs at less than about 5% of this value.

Various methods for incorporating the doping agent into polyphenylene can be employed to form charge-transfer complexes. These methods include, for example, exposure of the polymer in solid state or fused or in solution to a doping agent in the gaseous or vapor state or in liquid state, neat or in solution, or by intimately commingling solid materials. Similarly, electrochemical reactions can be used for the formation of charge-transfer complexes of polyphenylene.

In general, temperatures not over 100° C. especially temperatures less than or equal to room temperature are advantageously employed, especially for highly oxidizing dopants such as arsenic pentafluoride and sulfonating agents. However, as above noted, doping by halogens is an exception to this rule. Use of these dopants should include annealing at elevated temperatures of at least 200° C., especially 450° to 800° C. When fluorine gas is the doping agent, it is desirable to supply this gas initially not above 200° C., then to pump off the free fluorine gas remaining in the vapor phase and then the anneal the fluorine-doped composition at a temperature reaching at least 450° C.

In general, where the doping agent is a gas or a solid, having an appreciable vapor pressure at room temperature, such as arsenic pentafluoride, it is preferred to contact the solid polyphenylene with the doping agent in the gaseous or vapor state and preferably at reduced pressure. Where the doping agent is a solid at room temperature, having low vapor pressure, it is preferred to contact the polyphenylene with a solution of said doping agent in an inert solvent therefor. Representative solvents include diethyl ether, tetrahydrofuran and the like. However, basic solvents, such as ammonia, are preferably excluded in acceptor doping if the highest conductivities are desired.

The rate of addition of the dopant in the vapor phase to the polyphenylene is normally largely determined by the reaction temperature and the concentration (or vapor pressure) of the dopant. This rate is not crucial. However, if a complex having the optimized conductivity is required it is desirable to add the dopant at as slow a rate as is consistent with desired rates of manufacture. This normally requires reducing dopant concentration or gas pressure, reducing reaction temperature, and for the case of electrochemical reaction, reducing current flow from those values which provide maximum doping rate.

The dopant can be added to the polyphenylene either before, during, or after fabrication of the polymer into the form used for a particular application. For solution and/or melt processible polyphenylenes, conventional polymer processing technology can be used to derive desired forms including films and fibers for the polymer, wherein the dopant can generally be added before dissolution or melting of the polymer, during the solution or melt processing, or after the product shape is provided by the solution or melt processing. For the polyphenylenes which are insoluble and infusible, pressure compaction or pressure sintering techniques can be used to fabricate this polymer into desired shapes, as described in *J. Appl. Polym. Sci.* 22, pp. 1955–1969 (1978). Again, the dopant can in general be added either before, during, or after the molding process. However, for dopants which lack high temperature stability, the post-molding doping process is preferred. This latter process can also provide materials which are conductive on the surface and insulating inside, if the time of dopant exposure is insufficient for dopant diffusion into the bulk of the article.

A characteristic feature of preferred compositions of the present invention is that these compositions, rather than being black, like compositions described in the prior art, are instead colored; for example, a bronze-gold color for heavily doped potassium and sodium complexes and a green-metallic color for heavily doped AsF$_5$ complexes. These colors, which generally differ from those of the undoped polymers, reflect the changed electronic structure of the materials.

We have unexpectedly found that polyphenylene doped with a high concentration of AsF$_5$, of about 0.2 mole dopant per mole of phenylene unit, has a much higher stability than the corresponding heavily-doped AsF$_5$ complex of graphite. The reference, *Materials Science and Engineering* 31, 161–167 (1977) discloses that both Stage 1 and Stage 2 complexes of AsF$_5$ with graphite decompose rapidly in air, accompanied by gross exfoliation and emission of fumes of white solids. Also, AsF$_5$-doped polyacetylene is highly sensitive to air exposure, which results in rapid formation of the cubic modification of As$_2$O$_3$. By contrast, no fume emission or exfoliation is observed with the polyphenylene-AsF$_5$ complex and only relatively slow changes occur in electrical conductivity.

Also a subject of this invention is a shaped article of manufacture comprising the subject composition. Our discovery that polyphenylene forms conductive charge transfer complexes with certain electron acceptors and certain electron donors permits the fabrication of electrical conductors, semiconductor devices, such as rectifying diodes and transistors, n-p junctions, using the subject compositions and the wellknown technologies of device fabrication from n-type and p-type materials. The technology applied to the inorganic polymeric material, (SN)$_x$, described in *Appl. Phys. Lett.* 33, pp. 812–814, (1978) hereby incorporated by reference, for the construction of Schottky barrier devices, useful as solar cells, can be used to construct devices from the subject compositions. The subject compositions can function as either the metallic or the semiconductor part of such a metal-semiconductor barrier device, depending upon the extent of doping of the polymer. A major advantage of polyphenylene as a junction material in such applications, as compared with the inorganic polymer $(SN)_x$, or the polyacetylene complexes described in *Appl. Phys. Lett.* 33, pp. 18-20 (1978), lies in its unusually high thermal stability.

Also, highly conducting polyphenylene complexes are highly absorbing over a wide spectral region in the infrared region. Hence, these materials can be used as infrared absorbers as, for example, in protective eyeglass and solar energy applications.

Also, since the subject compositions are conducting, they can be used as antistatic materials or devices, such as a shaped gasket inside the lid of a solvent can.

The conducting doped compositions strongly absorb radio frequency and microwave radiation, so they can be used to shield sensitive electrical circuits from electromagnetic interference or to contain sources of such radiation.

In addition, the doped polymers differ from the undoped polymers in that direct metal desposition thereon via electroplating is possible. The conductivity resulting from the doping process can provide the current carrying capability required for electroplating.

EXAMPLES

Polyphenylene used in the Examples below was prepared by the oxidative cationic polymerization of benzene as described in *J. Org. Chem.* 29, pp. 100-104 (1964) and hereby incorporated by reference for that purpose; or was purchased, if so indicated below. Elemental and functional analyses for the reaction product are in agreement with those described in the above reference for a polyphenylene consisting essentially of para-phenylene units. Unless otherwise indicated, doping and measurement of conductivity, in the Examples below, was at room temperature.

EXAMPLE 1

This example describes the doping of poly(para-phenylene) with an electron acceptor ($AsF_5$) to produce a highly conducting material.

One and one-half grams of poly(p-phenylene) in powder form, prepared as in the *J. Org. Chem.* reference above cited, was compressed into a cylindrical pellet at $2.76 \times 10^5$ kPa (40,000 psi) in a 2.54 cm (1") diameter stainless steel mold, removed from the mold, and annealed at 400° C. under ultra-high purity, commercially obtained nitrogen gas for 24 hours.

This annealing was only precautionary, to remove possible byproducts, and was found to have no substantial effect on the conductivity of the poly(p-phenylene), before or after doping.

Four electrodes were formed by painting an electrically conducting cement, Electrodag ™, on the flat surfaces of this disk in a collinear arrangement 1 mm apart. Platinum wires were used to contact these electrodes, so that electrical conductivity could be continuously monitored, during a doping process, by the standard four-point probe technique.

The sample was then placed in a heat-resistant borosilicate glass cell provisions for evacuation and for the introduction of dopants, and with glass-metal seals to permit exit of wires connected to the four electrodes on the sample. The two outer electrodes were connected to a direct current source (Keithley Model 163). The center wires were connected to an electrometer (Keithley Model 616) for voltage measurement. This arrangement permitted continuous monitoring of the voltage and current, from which electrical conductivity could be calculated by Ohm's Law.

The cell containing the sample was evacuated to about $5 \times 10^{-6}$ torr ($6.7 \times 10^{-7}$ kPa). At this point the room temperature conductivity measured for the undoped polyphenylene pellet was about $3 \times 10^{-12}$ $ohm^{-1} cm^{-1}$. The $AsF_5$ was added to the conductivity cell in 22 equal increments of dopant during a two day period, wherein each increment produced about a 3 torr (0.40 kPa) increase in pressure for the cell volume. The electrical conductivity of the polyphenylene progressively increased over the two day period. During this time period the initial purple-black-metallic appearance of the compressed pellet changed to green-metallic. The final room temperature conductivity achieved after the 22th increment during the two day period was 130 $ohm^{-1} cm^{-1}$. This conductivity is greater than that of the original polymer by a factor of about $10^{14}$. The conductivity decreased slightly to about 120 $ohm^{-1} cm^{-1}$ upon standing in dynamic vacuum overnight. The temperature dependence of conductivity was measured down to 77° K., where the conductivity observed was 50 $ohm^{-1} cm^{-1}$. The observed temperature dependence from room temperature down to 77° K. can be described by an Arrhenius expression wherein the activation energy is calculated to be 0.01 eV.

EXAMPLE 2

This example describes the preparation of a highly conducting material by treatment of polyphenylene with an electron donor, potassium naphthalene, and the control of such conductivity through subsequent treatment with an electron acceptor, arsenic pentafluoride.

Poly(p-phenylene) powder, prepared as in Example 1, incorporating four parallel platinum wires, was compressed into a 12 mm diameter disc-shaped pellet at $8.27 \times 10^5$ kPa (120,000 psi). The embedded wires were exposed by cutting away portions of the solid pellet until the exposed portions were long enough to permit attachment to the four-point probe conductivity apparatus described in Example 1. After heating at 400° C. for 24 hours under ultra high purity nitrogen gas, the wired pellet was positioned in a glass cell as in Example 1 along with 0.8 g powdered potassium naphthalene. The cell was evacuated and oxygen-free tetrahydrofuran (THF) admitted until the pellet was totally immersed in the potassium naphthalene solution.

Conductivity in the pellet increased over a period of 96 hours until a level of 7.2 $ohm^{-1} cm^{-1}$ was attained. Washing the pellet, now a bronze-gold color, thoroughly with THF and drying under vacuum did not affect this conductivity value. The thoroughly washed pellet was then exposed to arsenic pentafluoride at a pressure of 45 torr (6.0 kPa). The conductivity value dropped to 0.57 $ohm^{-1} cm^{-1}$ after 33 minutes, then increased once again to 44 $ohm^{-1} cm^{-1}$ in two more hours.

The conductivity of the potassium treated poly(p-phenylene) decreased slightly when the pellet was cooled to liquid nitrogen temperature. The subsequent treatment with arsenic pentafluoride gave a material whose conductivity decreased from 44 $ohm^{-1} cm^{-1}$ to 24 $ohm^{-1} cm^{-1}$ when cooled to liquid nitrogen temperature.

EXAMPLE 3

Poly(p-phenylene) powder, prepared as in Example 1, was compression molded at $8.27 \times 10^5$ kPa (120,000 psi) pressure into five different cylindrical pellets, each 1.25 cm in diameter and about 0.1 cm thick. These pellets were annealed at 400° C. under dry nitrogen gas for 24 hours and weighed after returning to room temperature. Electrodes were applied to one of the pellets (sample #1) as described in Example 1. This pellet was suspended in the conductivity apparatus by four platinum wires attached to the electrodes as described in Example 1. The remaining four pellets were placed on a platinum screen support in the conductivity apparatus, which was evacuated to $10^{-6}$ torr ($1.3 \times 10^{-7}$ kPa). The conductivity of sample #1 (undoped) was about $10^{-12}$ ohm$^{-1}$ cm$^{-1}$. Conductivities of the other samples were not measured prior to doping.

Arsenic pentafluoride, in the vapor form, was introduced into the conductivity apparatus at a pressure of 455 torr (60.7 kPa) and the conductivity was measured as a function of time after exposure to $AsF_5$. The results are listed below in Table I.

TABLE I

| $AsF_5$ Exposure Time (hours) | Conductivity, (ohm$^{-1}$ cm$^{-1}$) |
|---|---|
| 0 | $10^{-12}$ |
| 0.1 | 0.27 |
| 0.2 | 0.41 |
| 0.5 | 0.70 |
| 1.0 | 1.4 |
| 2.0 | 5.5 |
| 3.0 | 72.3 |
| 4.0 | 140.3 |
| 5.0 | 154.9 |

After five hours of exposure to $AsF_5$, the cell was evacuated to $10^{-6}$ torr ($1.3 \times 10^{-7}$). The conductivity decreased slightly on evacuation to 145 ohm$^{-1}$cm$^{-1}$ after 16 hours. The conductivity apparatus was transferred to a nitrogen-filled glove bag. Samples 2 through 5 were weighed and their conductivities measured in the glove bag. Results are shown below in Table II. The conductivities of the pellets were measured using a Jandel Engineering Ltd. four-point probe apparatus and the Keithley Voltmeter and current source.

TABLE II

| Sample # | Initial Wt. (g) | Final Wt. (g) | Wt. Fraction $AsF_5$ | Conductivity (ohm$^{-1}$cm$^{-1}$) |
|---|---|---|---|---|
| 1 | 0.13707 | not measured | | 145 |
| 2 | 0.13581 | 0.20971 | 0.352 | 103 |
| 3 | 0.13775 | 0.24416 | 0.436 | 170 |
| 4 | 0.13968 | 0.20746 | 0.327 | 103 |
| 5 | 0.14030 | 0.22086 | 0.365 | 140 |

The average conductivity value was 132 ohm$^{-1}$ cm$^{-1}$. The average weight fraction of $AsF_5$ in the doped samples was 0.37; this corresponds to a 0.21 mole fraction of $AsF_5$ in $(C_6H_4)_x$ or about one $AsF_5$ molecule per four phenylene units. The conductivity of sample #1 was measured as a function of time under exposure to laboratory air. No visible fumes or visible exfoliation of the sample were observed during air exposure. The conductivity results are listed below in Table III.

TABLE III

| Air exposure time (h) | Conductivity (ohm$^{-1}$ cm$^{-1}$) |
|---|---|
| 0 | 145 |
| 0.3 | 143 |
| 0.8 | 144 |
| 1.0 | 138 |
| 1.5 | 128 |
| 2.5 | 112 |
| 3.4 | 99 |
| 4.0 | 90 |
| 4.7 | 78 |
| 5.0 | 75 |

After a few hours exposure to air, droplets of an acidic liquid appeared on the surface of the pellet. After five hours, Sample #1 was dipped in water for about 1 minute; the conductivity was unaffected.

EXAMPLE 4

The following example illustrates doping with a p-type and dopant and then adding, as a compensating agent, an electron donor.

A 1.0 cm diameter×0.1 cm thick pellet of poly(p-phenylene) was prepared and used for conductivity measurement as described in Example 1. After annealing at 400° C. under nitrogen gas for 24 hours, the pellet was exposed to $AsF_5$ vapor until the conductivity of the pellet increased to $1.1 \times 10^{-2}$ cm$^{-1}$. At this point the apparent activation energy for conductivity was 0.02 eV. The doped pellet was then exposed to ammonia gas. Within ten minutes the conductivity decreased to $1 \times 10^{-8}$ ohm$^{-1}$ cm$^{-1}$. After evacuation of the cell to $10^{-5}$ torr, the conductivity further decreased to $10^{-11}$ ohm$^{-1}$ cm$^{-1}$.

EXAMPLE 5 (COMPARATIVE EXAMPLE)

The following example demonstrates that bromine does not form a highly conducting complex with poly(p-phenylene) upon doping at room temperature.

A 2.54 cm (1") diameter by 0.1 cm thick poly(phenylene) pellet was prepared by pressing 2 gm of poly(phenylene) at $2.8 \times 10^5$ kPa (40,000 psi). This pellet was annealed for 24 h at 400° C. under nitrogen gas. The electrode and sample configuration were the same as described in Example 1. After evacuation to $10^{-6}$ torr ($1.3 \times 10^{-7}$ kPa), the conductivity of the undoped sample was $6 \times 10^{-12}$ ohm$^{-1}$cm$^{-1}$. $Br_2$ gas was introduced into the chamber, whereupon the conductivity rapidly increased to $10^{-7}$ ohm$^{-1}$ cm$^{-1}$. After 20 hours exposure to $Br_2$, the conductivity reached a peak value of $1.0 \times 10^{-6}$ ohm$^{-1}$ cm$^{-1}$. After 40 hours exposure to high vacuum, the conductivity decayed to $1.4 \times 10^{-7}$ ohm$^{-1}$cm$^{-1}$. A temperature dependence was recorded at this point yielding a calculated activation energy for conductivity=0.3 eV.

EXAMPLE 6

This example describes the preparation of a highly conductive material by treatment by poly(p-phenylene) with an electron donor (sodium naphthalene).

Poly(p-phenylene) powder, as prepared in Example 1, was compressed into a disc-shaped pellet (12 mm in diameter, 1 mm thick) at $8.3 \times 10^5$ kPa (120,000 psi). After heating at 400° C. for 24 h under high purity nitrogen gas, the metallic looking purple-colored pellet was placed in one leg of an H-shaped borosilicate glass cell. This cell is designed to allow irrigation of the pellet by a THF solution of sodium naphthalene prepared by interacting sodium metal (0.1 g) with naphthalene (0.6 g) in dry, $O_2$-free THF in the other leg. After 24 h of contact with the pellet, the sodium naphthalene solution was filtered off and the pellet washed in dry THF until no discoloration of the wash liquid occurred. Drying the pellet overnight under a vacuum of $5 \times 10^{-6}$ torr ($6.7 \times 10^{-7}$ kPa) gave a golden-brown material which showed signs of swelling and flaking. Measurement of conductivity with an ohmmeter in a strictly controlled dry argon atmosphere gave a lower limit of $2 \times 10^{-1}$ ohm$^{-1}$ cm$^{-1}$ for the conductivity.

EXAMPLE 7

Two 4 mg KBr pellets were prepared by compression with an applied torque of 23.7 N.m (210 inch-pound) in a MiniPress TM pellet-maker for infrared spectroscopy. One mg of poly(p-phenylene), prepared as in Example 1, was compressed onto the surface of one of these pellets using the above molding conditions.

An IR spectrum was taken of the poly(p-phenylene)/KBr pellet as the sample and the KBr pellet as the reference.

Both of these pellets were contacted with $AsF_5$ vapor using the same method as described in Example 1. An IR spectrum was again taken with poly(p-phenylene)-/$AsF_5$/KBr as the sample and KBr pellet as the reference. The spectrum for undoped poly(p-phenylene) was essentially identical to that reported in *J. Org. Chem.*, 29, pp. 100–104 (1964), with prominent vibrational transitions at 800, 1000, 1400 and 1480 cm$^{-1}$. These vibrational transitions are completely masked in the doped sample which shows large increases in infrared absorption over the range from at least 4000 cm$^{-1}$ down to at least 200 cm$^{-1}$, which are the limits of the measurement. On exposure of the doped pellet to $NH_3$ vapor, the infrared absorption dramatically decreased and the vibrational transitions associated with the undoped polymer reappeared. This effect is due to compensation of $AsF_5$ acceptor by the $NH_3$ donor as in Example 4. This experiment demonstrates that the conductive complex strongly absorbs over a broad band in the infrared, which indicates that such materials can be used in applications requiring an infrared shield, such as in solar energy and optical applications.

Furthermore, the reversibility of the optical behavior demonstrates that the novel properties of the subject compositions do not arise because of irreversible covalent bond formation, between a dopant species and the polymer chains, such as the replacement of the chain hydrogens with halogens. It is well known in the art that substitution reactions such as sulfonation, nitration and halogenation will occur, forming stable products, if a highly oxidizing chemical is added at relatively high temperature.

EXAMPLE 8

(A) The doping of p-quaterphenyl, the four phenylene unit oligomeric compound with the electron acceptor, $AsF_5$, gives a highly conducting material.

A 12.7 mm (½") disc-shaped pellet of commercially obtained p-quaterphenyl powder pressed at $8.3 \times 10^5$ kPa (120,000 psi) was attached to a four point conductivity-measuring apparatus, as described in Example 1. The conductivity cell containing the wired pellet was evacuated to $55 \times 10^{-6}$ torr ($6.7 \times 10^{-7}$ kPa), and then $AsF_5$ was introduced throughout the vacuum line, including the conductivity cell to a pressure of 7 torr (0.93 kPa). Almost immediately the pellet changed color from ivory to a light green, with an accompanying rise in conductivity. The contents of the vacuum line were condensed into the cell using liquid nitrogen and then the cell was allowed to warm to room temperature. The pellet's color deepened through dark green to a metallic purple; the conductivity of the pellet at this point was $3.9 \times 10^{-3}$ ohm$^{-1}$ cm$^{-1}$. After 30 minutes another 7 torr (0.93 kPa) pressure increment of $AsF_5$ was introduced into the vacuum line and condensed into the conductivity cell. After warming to room temperature the pellet had blackened. The conductivity rose to $1.2 \times 10^{-3}$ ohm$^{-1}$cm$^{-1}$. After exposure under these conditions for 18 hours the conductivity was 8.9 ohm$^{-1}$ cm$^{-1}$. Exposure to air or to $(CH_3)_2NH$ causes fading of the color and decrease in the conductivity of these doped compositions.

(B) Similar phenomena and even higher conductivities, up to 50 ohm$^{-1}$cm$^{-1}$, have been observed in our tests with p-terphenyl exposed to 400 torr (53 kPa) pressure of $AsF_5$. Comparison of the IR spectrum of the doped p-terphenyl (after reaction with $(CH_3)_2NH$ to "compensate" the $AsF_5$ dopant followed by heating at 400° C. to drive off unreacted terphenyl and compensated dopant) vs. p-terphenyl and poly(p-phenylene) shows evolution of the spectrum, upon doping the terphenyl, toward that of the poly(p-phenylene). From the relative strength of the bands near 800 cm$^{-1}$ and 765 cm$^{-1}$ (out-of-plane C-H vibrations of para-substituted and monosubstituted phenyl rings) the constituent oligomers in this doped composition were determined to contain from 6 to 12 phenylene units, averaging about 9 phenylene units.

(C) Meta-terphenyl has also been found in our tests to become conductive upon doping with $AsF_5$. Our studies indicate that the m-terphenyl is polymerized simultaneously, probably into polymer chains linked via the outer phenyl rings, forming units having para-phenylene linkages and meta-phenylene linkages, of the structure:

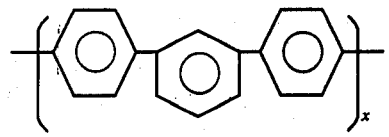

(D) We have also found that p-phenylene oligomers become conductive upon exposure to potassium in the manner of Example 2 above; but the resulting compositions show no evidence of polymerization.

(E) Similar results have been obtained in our tests with the phenylene oligomers biphenyl (Example 9), p-terphenyl (Example 10), p-quinquephenyl (Example 11) and p-sexiphenyl.

EXAMPLE 9

This example describes the doping of biphenyl with an electron acceptor ($AsF_5$) to produce a highly conducting material.

Crystalline powder of biphenyl was commercially obtained (from Aldrich Chemical Co.). One-half gram of this powder was pressed into a cylindrical pellet at about 480,000 kPa (70,000 psi) in a 1.27 cm (0.5 inch) diameter stainless steel mold.

Four electrodes were formed on the flat surfaces of this disk by painting thereon an electrically conducting graphite cement (available as "Electrodag") in a collinear arrangement 1 mm apart. Platinum wires were used to contact these electrodes, so that throughout the subsequent doping process electrical conductivity could be continuously monitored, using the standard four-point probe technique per Jour. Am. Chem. Soc. 100 pp. 1014–16 (1978).

The sample was then placed in a heat resistant borosilicate glass cell with provisions for evacuation and introduction of the dopant, and with glass-metal seals to permit exit of wires connected to the four electrodes on the sample. The two outer electrodes were connected to a direct current source (a Keithly Model 163 current source). The center wires were connected to an electrometer (a Keithley Model 616 electrometer) for voltage measurement. This arrangement permitted continuous monitoring of the voltage and current, from which electrical conductivity could be calculated by Ohm's Law.

The cell containing the sample was evacuated to about $5 \times 10^{-6}$ torr ($6.7 \times 10^{-7}$ kPa). At this point the conductivity measured for the undoped biphenyl pellet was less than $10^{-9}$ ohm$^{-1}$cm$^{-1}$, i.e. this composition was insulating. Then AsF$_5$ was added to the conductivity cell until the pressure was about 600 torr (80.0 kPa). The electrical conductivity increased as the addition of AsF$_5$ proceeded. The pellet, originally pure white, turned first a light green then eventually a deep blue at the final maximum conductivity measurement of 1.4 ohm$^{-1}$cm$^{-1}$.

EXAMPLE 10

This example describes the preparation of a highly conducting material by doping p-terphenyl with an electron acceptor (AsF$_5$).

Laser grade crystalline powder of p-terphenyl was commercially obtained (from Eastman Kodak Co.). A pellet was formed and doped as in Example 9 above. The conductivity of the resulting pellet, measured as in Example 9, increased from less than $10^{-9}$ to 4.16 ohm$^{-1}$cm$^{-1}$.

EXAMPLE 11

This example describes the doping of p-quinquephenyl with an electron acceptor (AsF$_5$) to produce a highly conducting material.

p-Quinquephenyl crystalline powder was commercially obtained (from Pfaltz & Bauer Inc.). A pellet was formed and doped as in Example 9 above. The conductivity of the resulting pellet, measured as in Example 9, increased from insulating to 5.79 ohm$^{-1}$ cm$^{-1}$.

EXAMPLE 12

This example describes the doping of poly(para-phenylene) with chlorine to produce a highly conducting material which is stable in air.

Poly(p-phenylene) was prepared as in Example 1 above.

A pellet of this poly(p-phenylene) was prepared as in Example 9 above and was annealed at 400° C. under ultra high purity commercially obtained nitrogen gas for 24 h. The annealed pellet of poly(p-phenylene) was placed in a glass cell which was evacuated to about $5 \times 10^{-6}$ torr ($6.7 \times 10^{-7}$ kPa). The pressure in the cell was increased with chlorine gas, so that the mole ratio of chlorine to phenylene units in the polyphenylene was about 3:1. The cell was closed off, the chlorine gas was condensed using liquid nitrogen, and the cell was sealed using an oxygen/gas torch.

The sealed cell containing the poly(p-phenylene) pellet and chlorine gas was heated at 500° C. for 24 h after which it was transferred to an argon-filled glove box where it was allowed to return to room temperature and where the conductivity, measured as in Example 9, was found to be $2.7 \times 10^{-1}$ ohm$^{-1}$cm$^{-1}$.

The conductivity of the pellet was then measured in air, and showed no significant change. After six months in air the conductivity of the pellet was again measured and there was still no significant change in its conductivity.

EXAMPLE 13

This example describes the doping of poly(p-phenylene) with chlorine at a very low Cl$_2$/phenylene mole ratio to produce a highly conducting material which is stable in air.

The pellet was prepared and doped as in the previous Example 12, except that the Cl$_2$:phenylene mole ratio used was only 1:20.

After doping, the pellet had a conductivity of $1.35 \times 10^{-2}$ ohm$^{-1}$ cm$^{-1}$ which has remained stable in air (viz. $1.32 \times 10^{-2}$ ohm$^{-1}$ cm$^{-1}$) after a one year period.

EXAMPLE 14

In this example a pellet pressed from powdered poly(p-phenylene) was exposed to the vapors of fluorosulfonic acid (HSO$_3$F). In like manner powder of poly(p-phenylene) was contacted with liquid HSO$_3$F. In both cases the color of the pellet and the powder changed and highly conducting materials were produced.

A pressed pellet of poly(p-phenylene) one half inch (12.7 mm) diameter and one millimeter thick was placed in a glass tube which was evacuated. Vapors of fluorosulfonic acid were admitted to this tube and allowed to contact the pellet freely for 24 hours at room temperature. At the end of this time the pellet of poly(p-phenylene) had changed color from purple to metallic green. The conductivity of this pellet was measured using the standard four probe method. The poly(p-phenylene) pellet gives a conductivity of 0.4 ohm$^{-1}$ cm$^{-1}$.

In a second set of experiments fluorosulfonic acid was distilled into the tube in enough quantity to cover the powder. After contact at room temperature for 16 hours the dark tan powder had turned black. Following thorough removal of excess liquid under vacuum, the powder was put into a drybox and pressed into a pellet, which was metallic green in color. Conductivity reading of this pellet gives 30 ohm$^{-1}$ cm$^{-1}$ at room temperature.

EXAMPLE 15

This example describes the doping of poly(p-phenylene) with fuming sulfuric acid to produce a highly conducting material.

Poly(p-phenylene) powder, prepared as in Example 1, was compression molded at about 827,000 kPa (120,000 psi) pressure into a cylindrical pellet 1.25 cm in diameter and 0.1 cm thick. This pellet was annealed at 400° C. under dry nitrogen gas for 24 h, then placed in a glass cell on the vacuum line under reduced pressure of $10^{-6}$ torr ($1.3 \times 10^{-7}$ kPa). The sample was exposed to vapors of fuming sulfuric acid of 15 to 18% free SO$_3$ content for seven hours, after which it had a conductivity of 1.82 ohm$^{-1}$ cm$^{-1}$. The sample was then maintained under reduced pressure of $10^{-6}$ torr ($1.3 \times 10^{-7}$ kPa) for 16 h. The conductivity had then decreased to 0.81 ohm$^{-1}$ cm$^{-1}$.

EXAMPLE 16

In this example a conducting material was formed from poly(p-phenylene) upon treatment with a combination of gaseous reactants. Neither gas alone was capable of providing a highly conducting polymer by exposure of the poly(p-phenylene) thereto.

A rectangular bar (13 mm × 5 mm × 1 mm) of pressed poly(p-phenylene) powder was heated in a stream of nitrogen gas for 24 hours at 400° C. Sample color was metallic purple-black. After this treatment four platinum wires were attached to the bar's surface with Electrodag ® conducting cement. As in Example 9 above, the sample was connected to wires inside a glass cell which permits continuous monitoring of electrical conductivity of samples exposed therein to gaseous environments. After evacuation of the cell the sample was exposed to 50.6 kPa trifluoromethylhypofluorite (CF$_3$OF). After 16 hours there was no change in sample color and no change in sample conductivity. At this time boron trifluoride was introduced to a pressure level of 50.6 kPa, and was condensed into the cell. Over a 20-day period conductivity rose to 5 ohm$^{-1}$ cm$^{-1}$. The sample had become black.

EXAMPLE 17

This example describes the doping of poly(para-phenylene) with an electron acceptor (SbCl$_5$) to produce a highly conducting material.

A 1.0 cm diameter of 0.1 cm thick pellet of poly(p-phenylene) was prepared and used for conductivity measurement as described in Example 1. After annealing at 400° C. under nitrogen gas for 24 hours, the pellet was exposed to liquid SbCl$_5$ for one hour. The liquid SbCl$_5$ was distilled out under vacuum. The pellet was dried under vacuum for three hours at $10^{-5}$ torr ($1.3 \times 10^{-6}$ kPa). Using the four-probe method at room temperature, a conductivity of 11.5 ohm$^{-1}$ cm$^{-1}$ was measured for this pellet.

EXAMPLE 18

This example describes the doping of poly(p-phenylene) with bromine at 500° C. to produce a highly conducting material.

Poly(p-phenylene) was prepared as in Example 1 above.

A pellet of this poly(p-phenylene) was prepared as in Example 1 above and was annealed at 400° C. under ultra high purity commercially obtained nitrogen gas for 24 h. The annealed pellet of poly(p-phenylene) was placed in a glass cell which was evacuated to about $5 \times 10^{-6}$ torr ($6.7 \times 10^{-7}$ kPa). Bromine gas was introduced into the cell so that the mole ratio of bromine to phenylene units in the polyphenylene was about 1:3. The cell was closed off, the bromine gas was condensed using liquid nitrogen, and the cell was sealed using an oxygen/gas torch.

The sealed cell containing the poly(p-phenylene) pellet and bromine gas was heated at 500° C. for 24 h, after which it was transferred to an argon-filled glove box where it was allowed to return to room temperature and where the conductivity was measured, using the four-probe method, and found to be $3.0 \times 10^{-1}$ ohm$^{-1}$ cm$^{-1}$.

The conductivity of the pellet was then measured in air, and showed no significant change.

EXAMPLE 19

This example describes the production of a conducting polymer complex by the doping of poly(p-phenylene) at room temperature with fluorine followed by a high temperature annealing.

A pellet of poly(p-phenylene) was prepared as in Example 1 above and was annealed at 400° C. under ultra high purity, commercially obtained nitrogen gas for 24 h. The annealed pellet of poly(p-phenylene) was placed in a stainless steel cell which was evacuated to about $5 \times 10^{-6}$ torr ($6.7 \times 10^{-7}$ kPa). Fluorine gas was introduced into the cell so that the gain in weight due to the fluorine gas added was 20.2% based on the weight of the poly(p-phenylene).

The cell was then evacuated and the sample transferred into a Pyrex cell using an argon-filled glove box. The conductivity measured at this point using the four-point probe technique was quite low (about $10^{-12}$ ohm$^{-1}$ cm$^{-1}$).

The Pyrex cell containing the fluorine-doped sample of poly(p-phenylene) was placed on a vacuum line where it was evacuated and sealed using an oxygen/gas torch. The sealed cell containing the fluorine-doped sample of poly(p-phenylene) was heated at 500° C. for 24 h after which it was transferred to an argon-filled glove box where it was allowed to return to room temperature and where the conductivity was measured using the four-probe method, and found to be 0.12 ohm$^{-1}$ cm$^{-1}$. Upon exposure of the sample to air, the conductivity decreased to $2.9 \times 10^{-2}$ ohm$^{-1}$ cm$^{-1}$.

EXAMPLE 20

Phenanthrene (C$_{14}$H$_{10}$), when exposed to liquid AsF$_5$, becomes a highly conducting polymeric material.

Phenanthrene powder was placed in a glass tube and evacuated thoroughly. One-third the molar amount of AsF$_5$ needed for molar equivalence with the phenanthrene sample was condensed into the tube at liquid nitrogen temperature and then warmed to $-23°$ C. The phenanthrene darkens to a green-black during this process. After addition of a total of one molar equivalent of AsF$_5$ in this manner, by two more condensations, the tube was allowed to reach room temperature and held there for two hours. After thorough vacuum evacuation, the resulting black powder was pressed into a pellet and the conductivity measured.

The purple-black pellet gives a conductivity of 0.53 ohm$^{-1}$ cm$^{-1}$.

EXAMPLE 21

This example describes the doping of phenanthrene with gaseous AsF$_5$, to give a conducting polymeric material.

A 12.7 mm ($\frac{1}{2}$") disc-shaped pellet of commercially obtained phenanthrene powder pressed at $8.27 \times 10 =$ kPa (120,000 psi) was placed in a glass tube on a vacuum line at reduced pressure of $5 \times 10^{-6}$ torr ($6.7 \times 10^{-7}$ kPa), and then AsF$_5$ was introduced to give pressure of 7 torr (0.9 kPa). After 16 h of exposure under these conditions the sample chamber was evacuated to about $5 \times 10^{-6}$ torr ($6.7 \times 10^{-7}$ kPa). The conductivity of the resulting pellet was found to be $1.6 \times 10^{-2}$ ohm$^{-1}$ cm$^{-1}$.

EXAMPLE 22

A sample of rod form coal tar pitch (Allied Chemical Lot. No. S/N 78316) was pulverized to a fine powder and placed in a glass tube, which was evacuated. $AsF_5$ was admitted to the glass tube to a pressure of about 50 kPa (about ½ atmosphere) and the reactants allowed to stand for 64 hours. After thorough evacuation of the tube it was taken into a drybox and a pellet pressed from the black solids. The conductivity of this pellet measures $10^{-3}$ ohm$^{-1}$ cm$^{-1}$.

Prior to doping, this coal tar pitch at room temperature is electrically insulating, similarly to undoped poly(p-phenylene).

EXAMPLE 23

Electrochemical Doping of Poly(p-phenylene) with $BF_4^-$.

A ½" (12 mm) diameter pellet of poly(p-phenylene) was prepared as in Example 1. The pellet, fitted with a platinum wire to allow its use as a cathode, was partially immersed in an electrolyte of 0.5 M $AgBF_4$ dissolved in acetonitrile. A platinum electrode served as anode to form an electrolytic cell.

10 volts was applied between the Pt anode and the Pt wire on the pellet. The current flowing in the external circuit was monitored with an electrometer. Over a period of 65 min. the current increased from $6 \times 10^{-5}$ amp to $3 \times 10^{-4}$ amp, which represents a total cell resistance, after the 65 minute period, of $3 \times 10^4$ ohms.

The cell resistance decreased to 200 ohms when electrical contact was made from the anode directly to a portion of the pellet surface that had been submerged in the solution; indicating that most of the $3 \times 10^4$ ohms resistance, measured across the cell, was due to resistance between the Pt anode and the pellet; and therefore, that the surface of the pellet had been made conductive by incorporation therein of doping agent via electrochemically doping the polymer most likely with the ion $BF_4^-$.

We claim:

1. A composition comprising a solid polymer consisting essentially of units having para-phenylene linkages, or of mixtures of such units with units having meta-phenylene linkages, and having incorporated therein an electron donor doping agent selected from the group consisting of Group IA metals and Group IA metal arenes and mixtures thereof, or an electron acceptor doping agent selected from the group consisting of Bronsted Acids, $SO_3$, $N_2O_5$, halides of Groups VIB, VIII, IIIA and VA; mixed halides and fluorine-containing peroxides and mixtures thereof, wherein:

(a) the direct current conductivity of the composition incorporating the electron donor agent alone is at least $10^{-3}$ ohm$^{-1}$ cm$^{-1}$; and (b) the direct current conductivity of the composition incorporating the electron acceptor agent alone, or in admixture with said electron donor agent, is at least $10^{-3}$ ohm$^{-1}$ cm$^{-1}$;

said conductivities being measured by the four-probe-in-line method at room temperature.

2. Composition of claim 1 wherein the direct current conductivity of such composition incorporating a doping agent can be reduced by at least 5-fold by addition thereto of a compensating reagent which would be a doping agent of the opposite type.

3. The composition of claim 1 having a direct current conductivity of at least $10^{-2}$ ohm$^{-1}$ cm$^{-1}$ at room temperature as measured by the four-probe method.

4. The composition of claim 1 wherein said doping agent is selected from Group IA metals, Group IA metal arenes, Group VA element halides and mixtures thereof.

5. The composition of claim 4 wherein said polymer consists at least in major part of units having paraphenylene linkages, and wherein said doping agent is present in an amount of about $10^{-5}$ to 2.0 moles per mole of phenylene unit in said polymer.

6. The composition of claim 5 wherein said polymer is essentially a solid, high molecular weight poly(p-phenylene), insoluble in conventional solvents and infusible.

7. The composition of claim 6 having conductivity of at least 1 ohm$^{-1}$ cm$^{-1}$.

8. The composition of claim 6 having conductivity of at least 10 ohm$^{-1}$ cm$^{-1}$.

9. The composition of claim 5 wherein said doping agent is potassium naphthalene, sodium naphthalene, $AsF_5$, or a mixture thereof.

10. The composition of claim 1 exhibiting the electrical properties of a semiconductor.

11. The composition of claim 10 wherein said semiconductor is of the n-type.

12. The composition of claim 10 wherein said semiconductor is of the p-type.

13. An article comprising the composition of claim 1 being an electrical conductor.

14. An article comprising the composition of claim 1 being a semiconductor.

15. An article comprising the composition of claim 1 being an n-p junction.

16. An article comprising the composition of claim 1 being an infrared radiation absorber.

17. An article comprising the composition of claim 1 being an antistatic device.

18. An article comprising the composition of claim 1 being an absorber of radio frequency radiation.

19. The composition of claim 1 wherein said doping agent is a Group IA metal.

20. The composition of claim 1 wherein said doping agent is $HSO_3F$.

21. The composition of claim 1 wherein said doping agent is $SO_3$.

22. The composition of claim 1 having a conductivity by the four-probe method of at least about 1 ohm$^{-1}$ cm$^{-1}$.

* * * * *